United States Patent
Madsen (10) Patent No.: US 12,480,210 B2
(45) Date of Patent: Nov. 25, 2025

(54) REDUCED DIAMETER CARRIER RING HARDWARE FOR SUBSTRATE PROCESSING SYSTEMS

(71) Applicant: LAM RESEARCH CORPORATION, Fremont, CA (US)

(72) Inventor: Eric Madsen, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 213 days.

(21) Appl. No.: 17/619,500

(22) PCT Filed: Jun. 15, 2020

(86) PCT No.: PCT/US2020/037699
§ 371 (c)(1),
(2) Date: Dec. 15, 2021

(87) PCT Pub. No.: WO2020/257095
PCT Pub. Date: Dec. 24, 2020

(65) Prior Publication Data
US 2022/0235459 A1   Jul. 28, 2022

Related U.S. Application Data (60) Provisional application No. 62/862,814, filed on Jun. 18, 2019.

(51) Int. Cl.
*C23C 16/458* (2006.01)
*C23C 16/455* (2006.01)
(Continued)

(52) U.S. Cl.
CPC ...... *C23C 16/4585* (2013.01); *C23C 16/4581* (2013.01); *H01J 37/32715* (2013.01);
(Continued)

(58) Field of Classification Search
CPC .......... H01J 37/32091; H01J 37/32183; H01J 37/32385; H01J 37/3244; H01J 37/32449;
(Continued)

(56) References Cited

U.S. PATENT DOCUMENTS 5,958,140 A * 9/1999 Arami ............... C23C 16/45502
156/345.52
6,257,168 B1 7/2001 Ni et al.
(Continued)

FOREIGN PATENT DOCUMENTS

CN   1373899 A   10/2002
CN   1825556 A   8/2006
(Continued)

OTHER PUBLICATIONS

International Search Report and Written Opinion of the ISA issued in PCT/US2020/037699, mailed Sep. 17, 2020; ISA/KR.
(Continued)

*Primary Examiner* — Kurt Sweely (57) ABSTRACT

A substrate support for a substrate processing system includes a baseplate, a ceramic layer arranged on the baseplate, and a carrier ring arranged on the ceramic layer. The ceramic layer has a first outer diameter, the carrier ring has a second outer diameter that is less than the first outer diameter, the ceramic layer includes a shoulder that extends from the second outer diameter of the carrier ring to the first outer diameter, and the shoulder slopes downward toward the first outer diameter.

15 Claims, 4 Drawing Sheets

(51) Int. Cl.
*H01J 37/32* (2006.01)
*H01L 21/687* (2006.01)

(52) U.S. Cl.
CPC .. *H01L 21/68735* (2013.01); *H01L 21/68757* (2013.01); *C23C 16/45565* (2013.01); *H01J 37/32642* (2013.01)

(58) Field of Classification Search
CPC .......... H01J 37/32642; H01J 37/32715; H01J 37/32724; C23C 16/45565; C23C 16/4581; C23C 16/4585; C23C 16/463; C23C 16/509; H01L 21/67069; H01L 21/68735; H01L 21/68785; H01L 21/68757; C30B 25/12
See application file for complete search history.

(56) References Cited

U.S. PATENT DOCUMENTS

| | | | | |
|---|---|---|---|---|
| 8,844,106 | B2* | 9/2014 | Chhatre | H01L 21/6719 29/235 |
| 2002/0022281 | A1 | 2/2002 | Flanner et al. | |
| 2003/0013315 | A1 | 1/2003 | Park et al. | |
| 2003/0015141 | A1 | 1/2003 | Takagi | |
| 2006/0219172 | A1 | 10/2006 | Kuo et al. | |
| 2007/0032081 | A1* | 2/2007 | Chang | H01L 21/467 438/689 |
| 2013/0334344 | A1* | 12/2013 | Leeser | H01J 37/32091 239/548 |
| 2016/0289827 | A1* | 10/2016 | Augustyniak | C23C 16/52 |
| 2017/0053820 | A1 | 2/2017 | Bosch et al. | |
| 2017/0069470 | A1* | 3/2017 | Murakami | H01J 37/32541 |
| 2017/0121819 | A1 | 5/2017 | Swaminathan et al. | |
| 2017/0301515 | A1* | 10/2017 | Madsen | C23C 16/45591 |
| 2017/0338140 | A1 | 11/2017 | Pape | |
| 2018/0182635 | A1* | 6/2018 | Tsukahara | C23C 16/4585 |
| 2018/0350653 | A1 | 12/2018 | Jeong et al. | |

FOREIGN PATENT DOCUMENTS

| | | |
|---|---|---|
| CN | 1847446 A | 10/2006 |
| CN | 101238553 A | 8/2008 |
| CN | 106024567 A | 10/2016 |
| CN | 107403747 A | 11/2017 |
| CN | 108987304 A | 12/2018 |
| EP | 1696470 A2 | 8/2006 |
| JP | 2003229408 A | 8/2003 |
| JP | 2004221266 A | 8/2004 |
| JP | 2017017316 A | 1/2017 |
| KR | 20090081067 A | 7/2009 |
| TW | 201829837 A | 8/2018 |
| WO | WO-0101445 A1 | 1/2001 |
| WO | WO-2011058851 A1 | 5/2011 |
| WO | WO-2014209492 A1 | 12/2014 |
| WO | WO-2019103722 A1 | 5/2019 |

OTHER PUBLICATIONS

Supplementary European Search Report and Written Opinion of the EPO issued in PCT/US2020/037699, mailed Jun. 6, 2023.
Office Action from corresponding Chinese Application No. 202080045297.7, dated Sep. 27, 2023.
Office Action from corresponding Taiwanese Application No. 109120200, dated Oct. 13, 2023.
Notice of Reason of Refusal from corresponding Japanese Application No. 2021-575229, dated Jul. 9, 2024.

* cited by examiner

REDUCED DIAMETER CARRIER RING HARDWARE FOR SUBSTRATE PROCESSING SYSTEMS

CROSS-REFERENCE TO RELATED APPLICATIONS

This application claims the benefit of U.S. Provisional Application No. 62/862,814, filed on Jun. 18, 2019. The entire disclosure of the application referenced above is incorporated herein by reference.

FIELD

The present disclosure relates to edge rings for a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform treatments such as deposition and etching of film on substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During deposition, the substrate is arranged on a substrate support and one or more precursor gases may be supplied to a processing chamber during one or more process steps. During etching, gas mixtures including one or more precursors may be introduced into the processing chamber and plasma may be used to initiate chemical reactions.

SUMMARY

According to certain embodiments, the present disclosure discloses a substrate support for a substrate processing system that includes a baseplate, a ceramic layer arranged on the baseplate, and a carrier ring arranged on the ceramic layer. The ceramic layer has a first outer diameter. The carrier ring has a second outer diameter that is less than the first outer diameter. The ceramic layer includes a shoulder that extends from the second outer diameter of the carrier ring to the first outer diameter.

In some embodiments, the shoulder slopes downward from the second outer diameter to the first outer diameter. In some embodiments, the shoulder includes a sloped portion and a non-sloped portion. The sloped portion extends from the second outer diameter to the non-sloped portion and the non-sloped portion extends from the sloped portion to the first outer diameter. In some embodiments, the non-sloped portion extends from the second outer diameter to the sloped portion and the sloped portion extends from the non-sloped portion to the first outer diameter.

In some embodiments, the shoulder slopes are at an angle between 10 and 45 degrees. In some embodiments, the ceramic layer is configured to support a 200 mm substrate. In some embodiments, an inner diameter of the carrier ring is less than a diameter of the substrate. In some embodiments, the ceramic layer includes a downward step at the second outer diameter of the carrier ring. And in some embodiments, the ceramic layer has a shoulder slopes downward from the downward step to the first outer diameter.

According to certain embodiments, the substrate processing chamber includes the substrate support and a showerhead having a third outer diameter that is less than the second outer diameter. In some embodiments, the third outer diameter is greater than an inner diameter of the carrier ring. In some embodiments, a bottom outer edge of the showerhead is radiused.

According to certain embodiments, the present disclosure discloses a substrate support for a substrate processing system includes a baseplate, a ceramic layer, and a carrier ring arranged on the ceramic layer. The ceramic layer has a first outer diameter, the carrier ring has a second outer diameter that is less than the first outer diameter, and the ceramic layer includes a shoulder that extends from the second outer diameter of the carrier ring to the first outer diameter.

In some embodiments, the shoulder slopes downward from the second outer diameter to the first outer diameter. In some embodiments, the shoulder includes a sloped portion and a non-sloped portion. In some embodiments, the ceramic layer is configured to support a 200 mm substrate. In some embodiments, an inner diameter of the carrier ring is less than a diameter of the substrate. In some embodiments, the ceramic layer includes a downward step at the second outer diameter of the carrier ring. In some embodiments, the downward step is at least 50% of a thickness of the ceramic layer.

Further areas of applicability of the present disclosure will become apparent from the detailed description, the claims and the drawings. The detailed description and specific examples are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support in a substrate processing system may include an edge ring. For example, the substrate support may include a ceramic layer arranged to support a substrate. The edge ring is arranged around an outer portion (e.g., outside of and/or adjacent to a perimeter) of the ceramic layer. The edge ring may be configured to confine plasma to a volume above the substrate, protect the substrate support from erosion caused by exposure to plasma and other process materials, etc. In some examples, the edge ring may correspond to a carrier ring configured to support an outer edge of the substrate.

When installed, results of various substrate processes performed on a substrate may be affected by features of a carrier ring (e.g., dimension such as a width of the carrier ring, an outer diameter of the carrier ring relative to the substrate, the substrate support, and/or a showerhead, etc.). In some examples, material (e.g., oxide material) may accumulate on a carrier ring over time, which may cause failure of substrates processed on the substrate support. In other examples, dimensions of the carrier ring may affect plasma characteristics, such as arcing of plasma toward the substrate, wrapping of plasma around the showerhead and the outer diameter of the substrate support, etc. An example substrate support configured for processing 200 mm substrates may have a diameter of 15.0" (381 mm). The carrier ring may also have a diameter of 381 mm. The showerhead may have a diameter of 9.0" (228.6 mm).

The carrier ring according to certain embodiments of the present disclosure has a reduced outer diameter relative to the outer frame of the substrate support. The reduced diameter of the carrier ring according to the principles of the present disclosure (e.g., a diameter of 11.0", or 279.4 mm) achieves desired plasma characteristics and prevents material accumulation. In some embodiments of the present disclosure, a shoulder of the substrate support may slope downward from the outer diameter of the reduced diameter carrier ring to the outer diameter of the substrate support. Accordingly, any material accumulation occurs on the sloped shoulder and has minimal effect on processes performed on the substrate. In some examples, a radius of a bottom outer edge of the showerhead is increased (e.g. from 0.15" (0.381 mm) to 0.19" (4.826 mm) to reduce an electric field sensitivity at the bottom outer edge.

Figure 1:
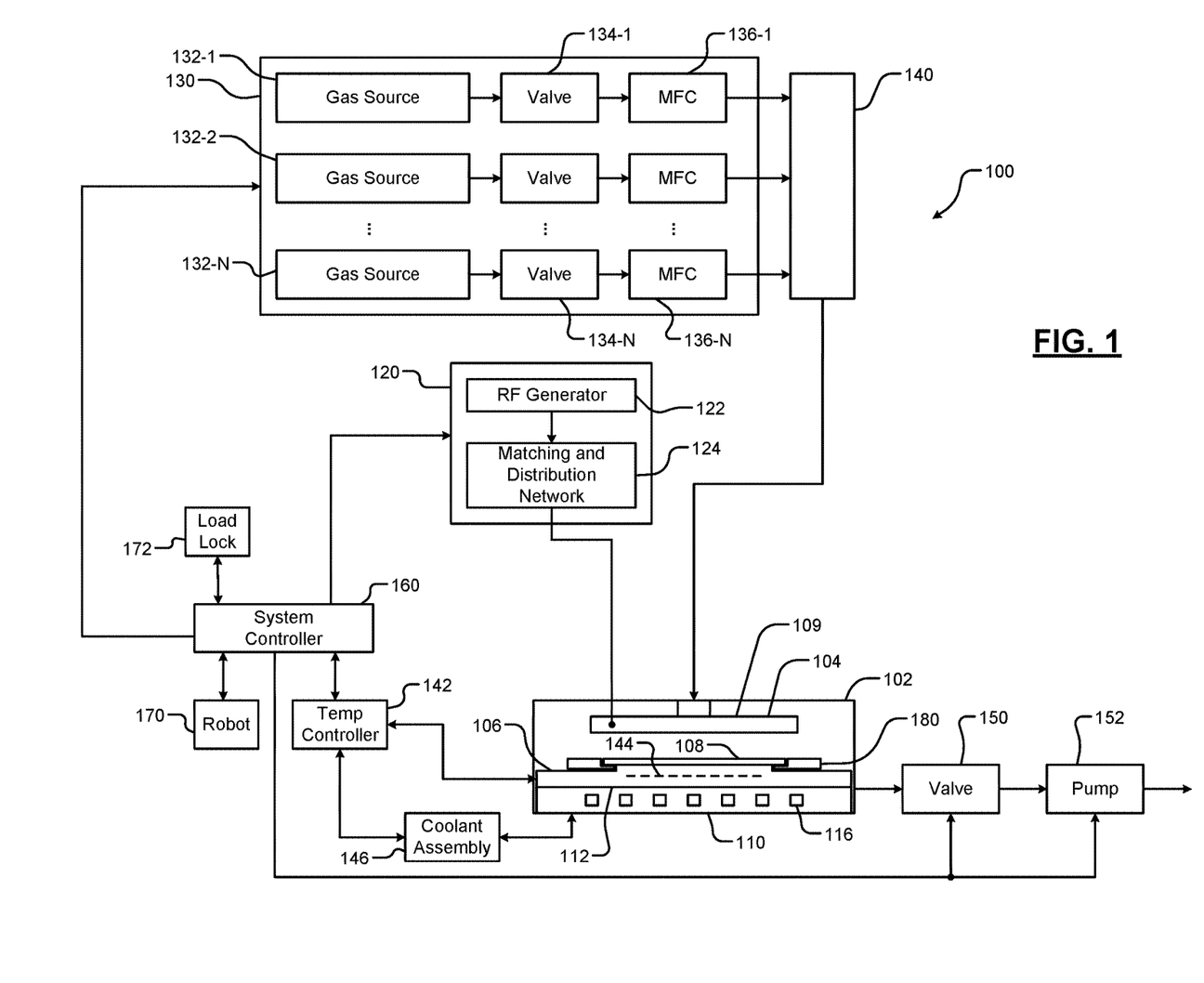
FIG. 1 is a functional block diagram of an example substrate processing system according to certain embodiments of the present disclosure.

Referring now to FIG. 1, an example substrate processing system 100 is shown. The substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While the substrate processing system 100 and chamber 102 are illustrated in FIG. 1, the principles of the present disclosure may be applied to other types of substrate processing systems and chambers, such as a substrate processing system that generates plasma in-situ, that implements remote plasma generation and delivery (e.g., using a plasma tube, a microwave tube), etc.

In some embodiments, the upper electrode 104 may include a gas distribution device such as a showerhead 109 that introduces and distributes process gases. The showerhead 109 may include a stem portion including one end configured to receive process gases. A base portion is generally cylindrical and extends radially outwardly from an opposite end of the stem portion at a location that is spaced from the top surface of the processing chamber 102. In some embodiments, a substrate-facing surface or faceplate of the base portion of the showerhead 109 includes a plurality of holes through which process gas or purge gas flows. In some embodiments, the upper electrode 104 may include a conducting plate and the process gases may be introduced in another manner.

In FIG. 1, the substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The upper electrode 104 and the baseplate 110 may be DC grounded, AC grounded or floating. In some embodiments, the RF generating system 120 may include an RF voltage generator 122 that generates the RF voltage that is fed by a matching and distribution network 124 to the upper electrode 104 or the baseplate 110. In some embodiments, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

According to certain embodiments, a gas delivery system 130 of FIG. 1 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. In some embodiments, vaporized precursor may be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. In some embodiments, the output of the manifold 140 is fed to the showerhead 109.

According to certain embodiments, a temperature controller 142 is connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. In some embodiments, the temperature controller 142 is configured to control the plurality of heating elements 144 to control a temperature of the substrate support 106 and the substrate 108.

The temperature controller 142, in some embodiments, is configured to communicate with a coolant assembly 146 to control coolant flow through the channels 116. For example, the coolant assembly 146 may include a coolant pump and reservoir. In some embodiments, the temperature controller 142 operates the coolant assembly 146 to selectively flow the coolant through the channels 116 to cool the substrate support 106.

In FIG. 1, a valve 150 and pump 152 are configured to evacuate reactants from the processing chamber 102 according to certain embodiments. In some embodiments, a system controller 160 is configured to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

In FIG. 1, the substrate support 106 includes a carrier ring 180. The carrier ring 180 is arranged on the ceramic layer 112 and surrounds the substrate 108. The carrier ring 180 extends below an outer edge of the substrate 108. In other words, an outer diameter of the substrate 108 is greater than an inner diameter of the carrier ring 180. The carrier ring 180 according to the principles of the present disclosure has a reduced diameter as discussed below in more detail.

Figure 2:
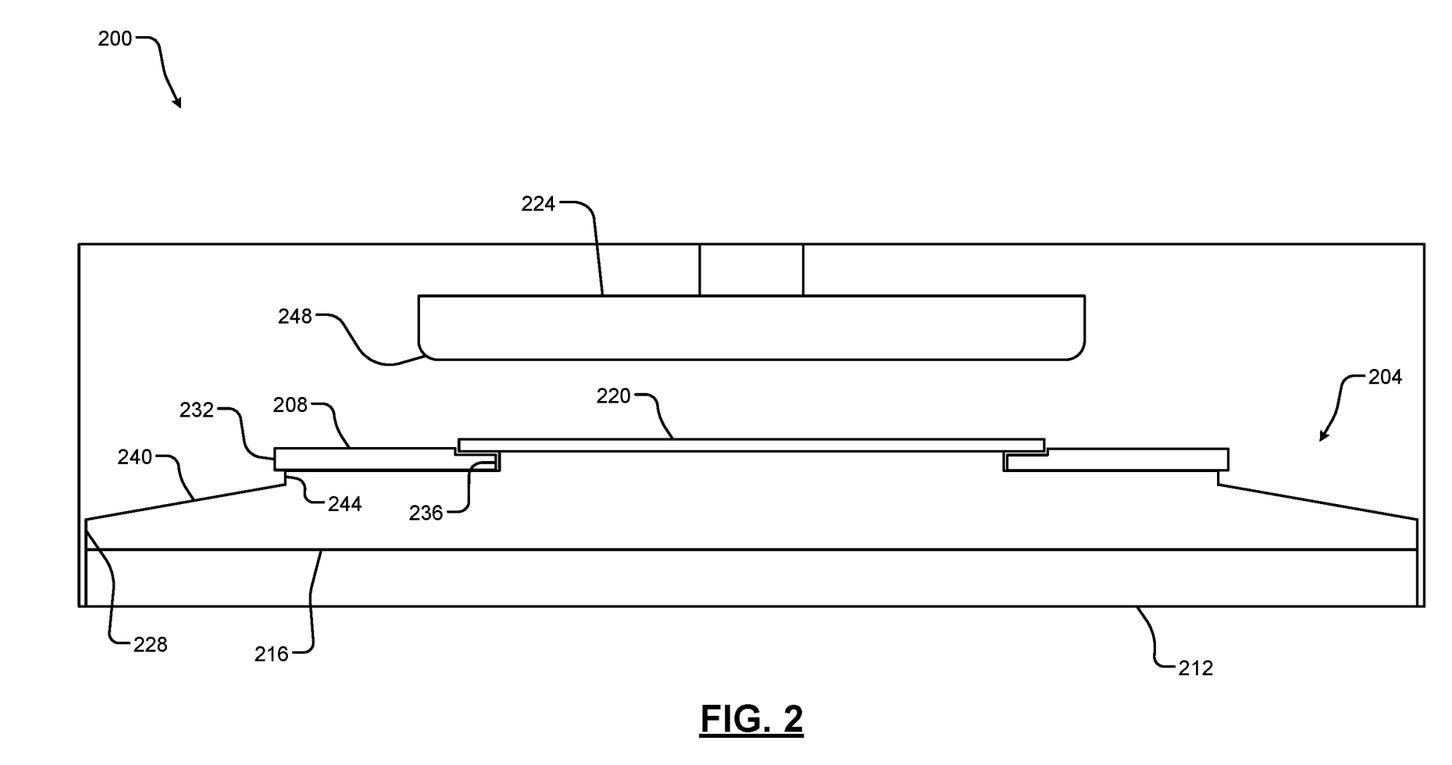
FIG. 2 illustrates an example substrate support including a carrier ring according to certain embodiments of the present disclosure.

FIG. 2 shows a processing chamber 200 includes a substrate support 204 including a carrier ring 208 having a reduced diameter according to certain embodiments of the present disclosure. The substrate support 204 includes a conductive baseplate 212 that supports a ceramic layer 216. A substrate 220 is arranged on the ceramic layer 216. In some embodiments, the substrate 220 is a 200 mm substrate. A gas distribution device such as a showerhead 224 is arranged above the substrate support 204 and provides and distributes process gases within the processing chamber 200 as described above.

An outer diameter 228 of the substrate support 204 (e.g., the ceramic layer 216) may be approximately 15.0" (e.g., 381 mm, +/−5 mm). The carrier ring 208 has a reduced outer diameter 232 diameter relative to the outer diameter 228 of the ceramic layer 216. For example, the outer diameter 232 of the carrier ring 208 may be approximately 11.0" (e.g., 279.4 mm, +/−5 mm). In other examples, the outer diameter 232 may be between 10.0" and 13.0" (e.g., between 254.0 and 330.2 mm). An inner diameter 236 of the carrier ring 208 may be less than the diameter of the substrate 220. For example, a difference between an inner diameter 236 of the carrier ring 208 and the diameter of the substrate 220 may be between 0.025" and 0.150" (e.g., between 0.635 and 3.81 mm). In other words, the inner diameter 236 may be between 7.72" and 7.85" (e.g., between 196.19 and 199.365 mm). In some examples, the carrier ring 208 has a thickness of approximately 0.167" (e.g., 4.25 mm, +/1 0.5 mm). In other examples, the thickness of the carrier ring 208 is approximately 0.101" (e.g., 2.57 mm, +/−0.5 mm). In some examples, the showerhead 224 may have a diameter of approximately 9.0" (e.g., 228.6 mm, +/−5 mm). In certain embodiments, the diameter of the showerhead 224 may be greater than the diameter of the substrate 220 and the inner diameter 236 and less than the outer diameter 232 of the carrier ring 208.

In some embodiments, a shoulder 240 of the ceramic layer 216 slopes downward from the outer diameter 232 of the carrier ring 208 to the outer diameter 228 of the substrate support 204. In some embodiments, the shoulder 240 slopes downward at an angle between 10 and 45 degrees. The angle may be dependent upon a difference between the outer diameter 228 and the outer diameter 232. In some examples, the ceramic layer 216 may include a downward step 244, beneath and near (for example, within 4 mm of) the outer diameter 232 of the carrier ring 208 and the shoulder 240 slopes downward from the step 244 as shown in FIG. 1.

The reduced outer diameter 232, the downward slope of the shoulder 240, and the step 244 allows plasma generated in a volume between the showerhead 224 and the substrate 220 to wrap around the outer diameter 232 of the carrier ring 208 toward the shoulder 240. Accordingly, arcing of the plasma toward the substrate 220 and material accumulation on the carrier ring 208 are reduced. For example, the downward slope causes any material accumulation to occur on the shoulder 240 instead of the carrier ring 208, and the downward step 244 facilitates the wrapping of the plasma around the outer diameter 232 of the carrier ring 208. In some examples, a bottom outer edge 248 of the showerhead 224 has a radius of approximately 0.19" (e.g., 4.826 mm, +/−1.0 mm) to reduce an electric field sensitivity at the bottom outer edge 248.

Figure 3A:
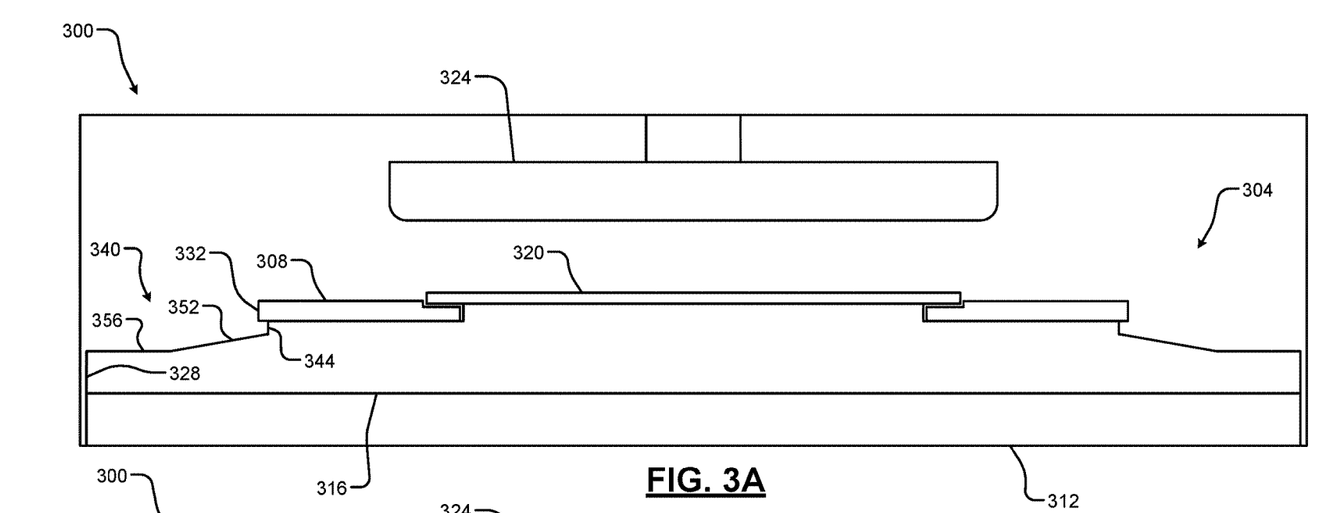
FIGS. 3A and 3B are example substrate supports including a carrier ring and a sloped shoulder according to certain embodiments of the present disclosure.
Figure 3B:
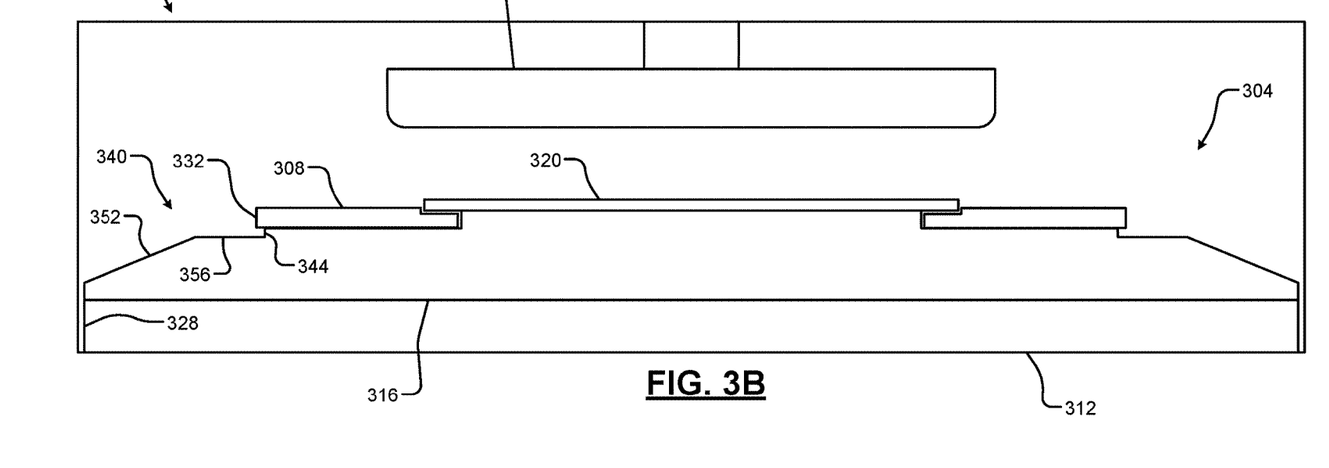

Referring now to FIGS. 3A and 3B, processing chambers 300 include substrate supports 304 including a carrier ring 308 having a reduced diameter according to certain embodiments of the present disclosure. Each of the substrate supports 304 includes a conductive baseplate 312 that supports a ceramic layer 316. A substrate 320 is arranged on the ceramic layer 316. A showerhead 324 is arranged above the substrate supports 304 and provides and distributes process gases within the processing chamber 300 as described above.

In these examples, a shoulder 340 of the ceramic layer 316 includes a sloped portion 352 that slopes downward from an outer diameter 332 of the carrier ring 308 to an outer diameter 328 of the substrate support 304 and a non-sloped (e.g., horizontal) portion 356. As shown in FIG. 3A, in some embodiments, the sloped portion 352 slopes downward from a step 344 and transitions to the non-sloped portion 356 and the non-sloped portion 356 extends from the sloped portion 352 to the outer diameter 328. In other embodiments, as shown in FIG. 3B, the non-sloped portion 356 extends from the downward step 344 to the sloped portion 352 and the sloped portion 352 extends from the non-sloped portion 356 to the outer diameter 328.

Although as shown the shoulder 340 includes the generally horizontal non-sloped portion 356, in other examples, the portion 356 may instead have a slope that is different from (e.g., has slope having a greater or lesser angle than) the slope of the sloped portion 352. In other examples, the shoulder 340 may include a step (e.g., a vertical downward step) between the sloped portion 352 and the non-sloped portion 356.

Figure 4A:
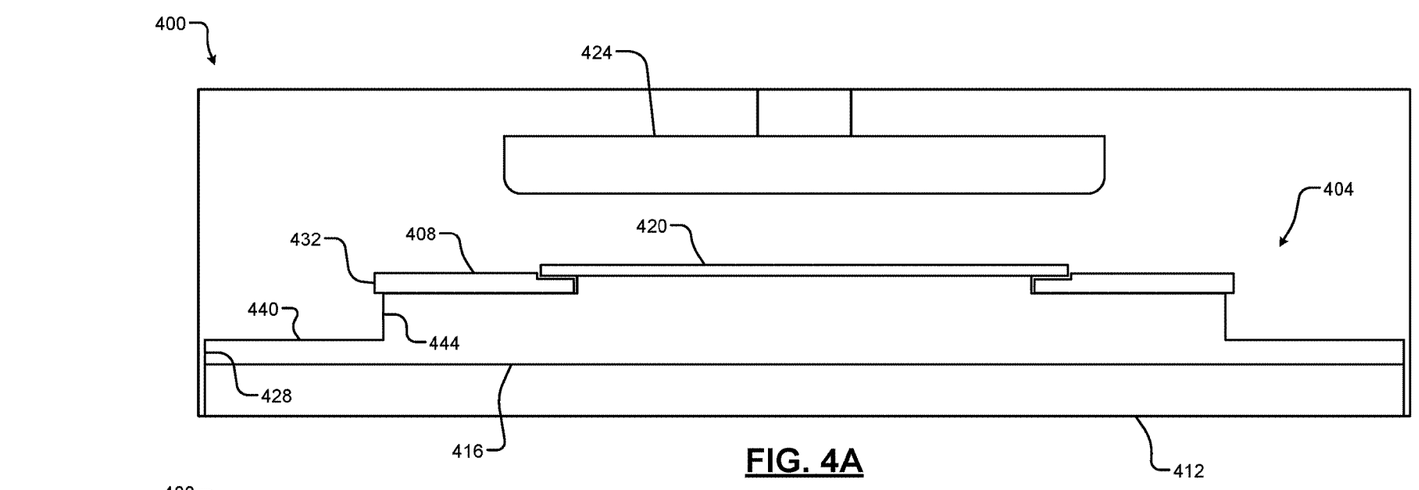
FIGS. 4A and 4B are example substrate supports including a carrier ring and a stepped shoulder according to certain embodiments of the present disclosure.
Figure 4B:
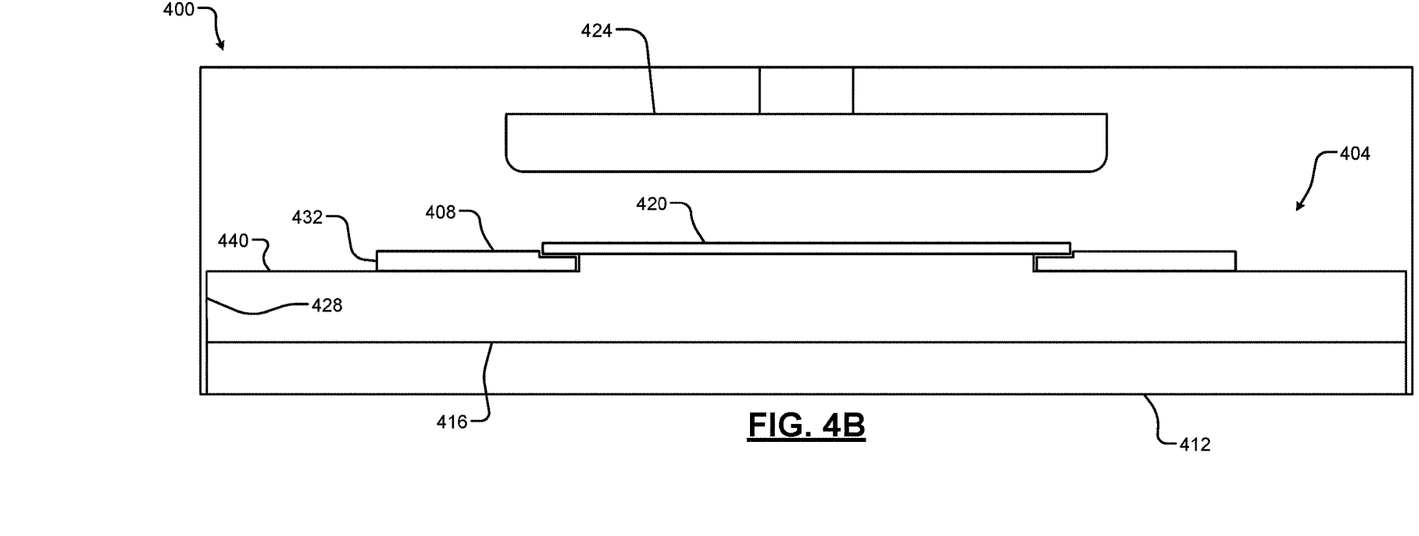

Referring now to FIGS. 4A and 4B, processing chambers 400 include substrate supports 404 including a carrier ring 408 having a reduced diameter according certain embodiments of the present disclosure. Each of the substrate supports 404 includes a conductive baseplate 412 that supports a ceramic layer 416. A substrate 420 is arranged on the ceramic layer 416. A showerhead 424 is arranged above the substrate supports 404 and provides and distributes process gases within the processing chamber 400 as described above.

In these examples, a shoulder 440 of the ceramic layer 416 is not sloped from an outer diameter 432 of the carrier ring 408 to an outer diameter 428 of the substrate support 404. Rather, the shoulder 440 of the ceramic layer 416 is generally horizontal. As shown in FIG. 4A, the ceramic layer 416 includes a downward step 444, beneath and near (for example, within 4 mm of) the outer diameter 432 of the carrier ring 408. The shoulder 440 extends from the step 444 to the outer diameter 428. The step 444 may be greater (i.e., higher) than the steps 244 and 344 described in FIG. 2 and FIG. 3 respectively. For example, the step 444 may be greater than 50% of a thickness of the ceramic layer 416 to facilitate wrapping of the plasma around the outer diameter 432 of the carrier ring 408 and reduce material accumulation on the carrier ring 408. In some embodiments, as shown in FIG. 4B, the shoulder 440 is not sloped and the ceramic layer 416 does not include the step 444 at the outer diameter 432 of the carrier ring 408.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing system, the substrate support comprising:
   a baseplate;

a ceramic layer arranged directly on the baseplate, wherein the ceramic layer has a first outer diameter, a second outer diameter, and a third outer diameter, and the first outer diameter of the ceramic layer defines a support surface configured to support a substrate; and a carrier ring arranged directly on the ceramic layer, wherein the carrier ring has a fourth outer diameter that is greater than the second outer diameter of the ceramic layer and is less than the third outer diameter of the ceramic layer, the fourth outer diameter is an outermost diameter of the carrier ring, the ceramic layer includes a shoulder that extends from the second outer diameter of the ceramic layer to the third outer diameter, and the shoulder slopes downward from a location nearby the second outer diameter of the ceramic layer toward the third outer diameter at an angle between 10 and 45 degrees, wherein the shoulder of the ceramic layer is configured to reduce material accumulation on the carrier ring, wherein, the ceramic layer includes a downward step at the second outer diameter of the ceramic layer, and the downward step is below a bottom surface of a radially outer portion of the carrier ring to prevent contact between the shoulder of the ceramic layer and the bottom surface of the carrier ring.

2. The substrate support of claim 1, wherein the shoulder slopes downward from the second outer diameter to the third outer diameter.

3. The substrate support of claim 1, wherein the shoulder includes a sloped portion and a non-sloped portion.

4. The substrate support of claim 3, wherein the sloped portion extends from the second outer diameter to the non-sloped portion and the non-sloped portion extends from the sloped portion to the third outer diameter.

5. The substrate support of claim 1, wherein the ceramic layer is configured to support a 200 mm substrate.

6. The substrate support of claim 5, wherein an inner diameter of the carrier ring is less than a diameter of the substrate.

7. The substrate support of claim 1, wherein the shoulder slopes downward from the downward step to the third outer diameter.

8. A processing chamber comprising the substrate support of claim 1 and further comprising a showerhead having a fifth outer diameter that is less than the second outer diameter.

9. The processing chamber of claim 8, wherein the fifth outer diameter is greater than an inner diameter of the carrier ring.

10. The processing chamber of claim 8, wherein a bottom outer edge of the showerhead is radiused.

11. A substrate support for a substrate processing system, the substrate support comprising:

a baseplate;

a ceramic layer arranged directly on the baseplate, wherein the ceramic layer has a first outer diameter, a second outer diameter, and a third outer diameter, and the first outer diameter of the ceramic layer defines a support surface configured to support a substrate; and a carrier ring arranged directly on the ceramic layer, wherein the carrier ring has a fourth outer diameter that is greater than the second outer diameter of the ceramic layer and is less than the third outer diameter of the ceramic layer, the fourth outer diameter is an outermost diameter of the carrier ring, and the ceramic layer includes a shoulder that slopes downward from a location nearby the second outer diameter of the ceramic layer to the third outer diameter, wherein the shoulder of the ceramic layer is configured to reduce material accumulation on the carrier ring, wherein, the ceramic layer includes a downward step at the second outer diameter of the ceramic layer, and the downward step is below a bottom surface of a radially outer portion of the carrier ring to prevent contact between the shoulder of the ceramic layer and the bottom surface of the carrier ring.

12. The substrate support of claim 11, wherein the shoulder includes a sloped portion and a non-sloped portion.

13. The substrate support of claim 11, wherein the ceramic layer is configured to support a 200 mm substrate.

14. The substrate support of claim 13, wherein an inner diameter of the carrier ring is less than a diameter of the substrate.

15. The substrate support of claim 11, wherein the downward step is at least 50% of a thickness of the ceramic layer.

* * * * *